United States Patent
Chen et al.

(10) Patent No.: US 10,856,439 B2
(45) Date of Patent: Dec. 1, 2020

(54) ROTATABLE WATER-COOLING TUBE AND ELECTRONIC DEVICE WITH SAME

(71) Applicant: AURAS Technology Co., Ltd., New Taipei (TW)

(72) Inventors: Chien-An Chen, New Taipei (TW); Chien-Yu Chen, New Taipei (TW); Yu-Jie Liu, New Taipei (TW); Kuan Cheng Lu, New Taipei (TW); Tai-Wen Chen, New Taipei (TW)

(73) Assignee: AURAS TECHNOLOGY CO., LTD., New Taipei (TW)

( * ) Notice: Subject to any disclaimer, the term of this patent is extended or adjusted under 35 U.S.C. 154(b) by 0 days.

(21) Appl. No.: 16/279,205

(22) Filed: Feb. 19, 2019

(65) Prior Publication Data

US 2020/0221604 A1 Jul. 9, 2020

(30) Foreign Application Priority Data

Jan. 4, 2019 (TW) .............................. 108100410 A

(51) Int. Cl.
*H05K 7/20* (2006.01)
*H05K 1/02* (2006.01)
*G06F 1/20* (2006.01)

(52) U.S. Cl.
CPC ....... *H05K 7/20218* (2013.01); *H05K 1/0272* (2013.01); *H05K 7/205* (2013.01); *G06F 1/20* (2013.01); *G06F 1/203* (2013.01); *H05K 2201/064* (2013.01)

(58) Field of Classification Search
CPC .. H05K 7/20218; H05K 7/205; H05K 1/0272; H05K 2201/064; H05K 7/20254; H05K 7/20509; H01L 23/46
USPC .................................. 361/698, 699, 702, 711
See application file for complete search history.

(56) References Cited

U.S. PATENT DOCUMENTS

| | | | | |
|---|---|---|---|---|
| 5,000,226 A | * | 3/1991 | Stoll | F15B 13/0853 137/884 |
| 7,808,783 B2 | * | 10/2010 | Goth | F25B 49/02 165/80.3 |
| 10,024,606 B2 | * | 7/2018 | Arvelo | F28F 1/12 |
| 10,385,996 B2 | * | 8/2019 | Arvelo | F16L 25/14 |
| 2006/0002086 A1 | * | 1/2006 | Teneketges | H01L 23/473 361/699 |
| 2006/0050483 A1 | * | 3/2006 | Wilson | H01L 23/473 361/702 |
| 2006/0073721 A1 | * | 4/2006 | Ohlsson | F16L 37/12 439/157 |
| 2007/0017658 A1 | * | 1/2007 | Lehman | H05K 7/20254 165/80.4 |

(Continued)

*Primary Examiner* — Stephen S Sul
(74) *Attorney, Agent, or Firm* — WPAT, PC

(57) ABSTRACT

A rotatable water-cooling tube and an electronic device with the water-cooling tube are provided. The water-cooling tube includes a first tube body, a second tube body, a third tube body, a first connector and a second connector. The first tube body is in communication with the second tube body and the third tube body through the first connector and the second connector. The first tube body is rotatable with the first connector and the second connector. Consequently, the first tube body can be freely rotated to a proper position. The technology of the present invention is helpful to assemble and disassemble the heat generation component under the rotatable water-cooling tube.

20 Claims, 9 Drawing Sheets

(56) References Cited

U.S. PATENT DOCUMENTS

| | | | |
|---|---|---|---|
| 2008/0174962 A1* | 7/2008 | Belady | G06F 1/20 |
| | | | 361/699 |
| 2009/0158757 A1* | 6/2009 | Marsala | F25B 23/006 |
| | | | 62/119 |
| 2011/0170943 A1* | 7/2011 | Su | F16C 11/0619 |
| | | | 403/74 |
| 2013/0094139 A1* | 4/2013 | Campbell | H05K 7/20627 |
| | | | 361/679.47 |
| 2015/0116942 A1* | 4/2015 | Teraki | H05K 7/20254 |
| | | | 361/702 |
| 2019/0056179 A1* | 2/2019 | Chialastri | H05K 7/20254 |
| 2019/0301650 A1* | 10/2019 | Bonomi | F16L 37/23 |
| 2019/0320548 A1* | 10/2019 | Gao | H05K 7/20781 |
| 2019/0373776 A1* | 12/2019 | Gao | H05K 7/20727 |

* cited by examiner

ROTATABLE WATER-COOLING TUBE AND ELECTRONIC DEVICE WITH SAME

FIELD OF THE INVENTION

The present invention relates to a water-cooling tube, and more particularly to a rotatable water-cooling tube and an electronic device with the water-cooling tube.

BACKGROUND OF THE INVENTION

Generally, a circuit board is provided with computer chips or processors. During the operations of these computer chips or processors, a great deal of heat is generated. If the heat is not effectively removed, the computer chips or processors are possibly overheated and damaged. For protecting the computer chips or processors, a cooling device and a water-cooling tube are provided to dissipate the heat away the computer chips or processors.

However, the conventional technologies still have some drawbacks. For example, the exiting water-cooling tube is usually a hard metallic tube. In addition, the water-cooling tube is inflexible and difficult to be bent. Due to the rigidity of the water-cooling tube, it is difficult to disassemble and assemble the water-cooling tube after the water-cooling tube is installed on the circuit board. Especially, for installing the computer chip or processor under the water-cooling tube, the whole water-cooling tube needs to be removed. After the procedure of installing the computer chip or processor is completed, the whole water-cooling tube is reinstalled. Even if the installation position of the computer chip is only located at a small area of the circuit board, the whole water-cooling tube needs to be removed before the computer chip is installed. Moreover, if the position of the chip is deviated from the position of the water-cooling tube after the chip and the water-cooling tube are installed, the fine adjustment is not easy. Since the conventional water-cooling tube is not user-friendly, there is a need of providing an improved water-cooling tube in order to overcome the drawbacks of the conventional technologies.

SUMMARY OF THE INVENTION

For overcoming the drawbacks of the conventional technologies, the present invention provides a rotatable water-cooling tube and an electronic device with the rotatable water-cooling tube. A portion of the water-cooling tube can be rotated freely. Due to this design, the heat generation component under the rotatable water-cooling tube can be easily assembled, disassembled or adjusted.

In accordance with an aspect of the present invention, there is provided a rotatable water-cooling tube. The rotatable water-cooling tube includes a first tube body, a second tube body, a third tube body, a first connector and a second connector. The first tube body includes a first tube channel, a first end and a second end. The first tube channel is in communication with the first end and the second end. The second tube body is arranged beside the first end of the first tube body. The third tube body is arranged beside the second end of the first tube body. The first connector is located at the first end of the first tube body. The first connector is in communication with the first tube body and the second tube body. The second connector is located at the second end of the first tube body. The second connector is in communication with the first tube body and the third tube body. The first tube body is rotatable with the first connector and the second connector.

In an embodiment, the first connector and the second connector are aligned with each other, and the first tube body is pivotally coupled to the first connector and the second connector.

In an embodiment, the first connector and the second connector are arranged along the same axial line, and the first connector and the second connector are rotatable about the axial line.

In an embodiment, an extending direction of the first tube body is perpendicular to the axial line.

In an embodiment, the first connector is arranged along a first axial line, and the second connector is arranged along a second axial line. The first axial line and the second axial line are in parallel with each other, but are not coaxial. The first connector is rotatable about first axial line. The second connector is rotatable about the second axial line.

In an embodiment, an extending direction of the first tube body is perpendicular to the first axial line and the second axial line.

In an embodiment, the second tube body includes a second coupling channel, and the first connector includes a first coupling channel. The first coupling channel is communication with the first tube channel and the second tube channel.

In an embodiment, the third tube body includes a third coupling channel, and the second connector includes a second coupling channel. The second coupling channel is communication with the first tube channel and the third tube channel.

In an embodiment, the first connector includes a first interface part and a first engaging spring, and the second connector includes a second interface part and a second engaging spring. The first engaging spring is disposed on a first inner wall of the first interface part. The second engaging spring is disposed on a second inner wall of the second interface part.

In an embodiment, the first connector and the second connector are quick connectors.

In an embodiment, the first tube body further includes a third end, and a heat dissipation element is installed on the third end of the first tube body.

In an embodiment, the heat dissipation element is in communication with the first tube channel of the first tube body, or the heat dissipation element is attached on an outer wall of the first tube body.

In accordance with another aspect of the present invention, there is provided an electronic device. The electronic device includes a rotatable water-cooling tube and a heat generation component. The rotatable water-cooling tube includes a first tube body, a second tube body and a third tube body, a first connector, a second connector. The first tube body includes a first tube channel, a first end and a second end. The first tube channel is in communication with the first end and the second end. The second tube body is arranged beside the first end of the first tube body. The third tube body is arranged beside the second end of the first tube body. The first connector is located at the first end of the first tube body. The first connector is in communication with the first tube body and the second tube body. The second connector is located at the second end of the first tube body. The second connector is in communication with the first tube body and the third tube body. The first tube body is rotatable with the first connector and the second connector. The heat generation component is in contact with the first tube body of the rotatable water-cooling tube.

In an embodiment, the electronic device further includes a base plate, and the heat generation component is installed on the base plate. As the first tube body is rotated with the first connector and the second connector, the heat dissipation element is selectively contacted with the heat generation component or away from the heat generation component.

In an embodiment, the rotatable water-cooling tube further includes a heat dissipation element, and the heat dissipation element is installed on the first tube body.

In an embodiment, as the first tube body is rotated, the heat dissipation element is selectively contacted with the heat generation component or away from the heat generation component.

In an embodiment, the first connector and the second connector are aligned with each other, and the first tube body is pivotally coupled to the first connector and the second connector.

In an embodiment, the first connector and the second connector are arranged along the same axial line, and the first connector and the second connector are rotatable about the axial line. An extending direction of the first tube body is perpendicular to the axial line.

In an embodiment, the first connector is arranged along a first axial line, and the second connector is arranged along a second axial line. The first axial line and the second axial line are in parallel with each other, but are not coaxial. The first connector is rotatable about first axial line. The second connector is rotatable about the second axial line. An extending direction of the first tube body is perpendicular to the first axial line and the second axial line.

In an embodiment, the second tube body and the third tube body are fixed on the base plate.

In an embodiment, the second tube body includes a second coupling channel, and the first connector includes a first coupling channel. The first coupling channel is communication with the first tube channel and the second tube channel.

In an embodiment, the third tube body includes a third coupling channel, and the second connector includes a second coupling channel. The second coupling channel is communication with the first tube channel and the third tube channel.

In an embodiment, the first connector includes a first interface part and a first engaging spring, and the second connector includes a second interface part and a second engaging spring. The first engaging spring is disposed on a first inner wall of the first interface part. The second engaging spring is disposed on a second inner wall of the second interface part.

In an embodiment, the first connector and the second connector are quick connectors.

A specified part of the rotatable water-cooling tube can be rotated freely. Consequently, the process of installing a heat generation component (e.g., a chip or a processor) on a specified area under the rotatable water-cooling tube can be simplified. After the rotatable water-cooling tube is rotated and lifted, the heat generation component can be installed without hindrance. After the procedure of installing the heat generation component is completed, the rotatable water-cooling tube is rotated in the reverse direction and returned to the original position. In addition, the rotatable water-cooling tube can be finely adjusted and attached on the underlying heat generation component (e.g., a chip or a processor). Consequently, the technology of the present invention is helpful to assemble and disassemble the heat generation component under the rotatable water-cooling tube and adjust the positions of the rotatable water-cooling tube and the heat generation component.

The above objects and advantages of the present invention will become more readily apparent to those ordinarily skilled in the art after reviewing the following detailed description and accompanying drawings, in which:

DETAILED DESCRIPTION OF THE PREFERRED EMBODIMENT

The present invention will now be described more specifically with reference to the following embodiments and accompanying drawings.

Figure 1:
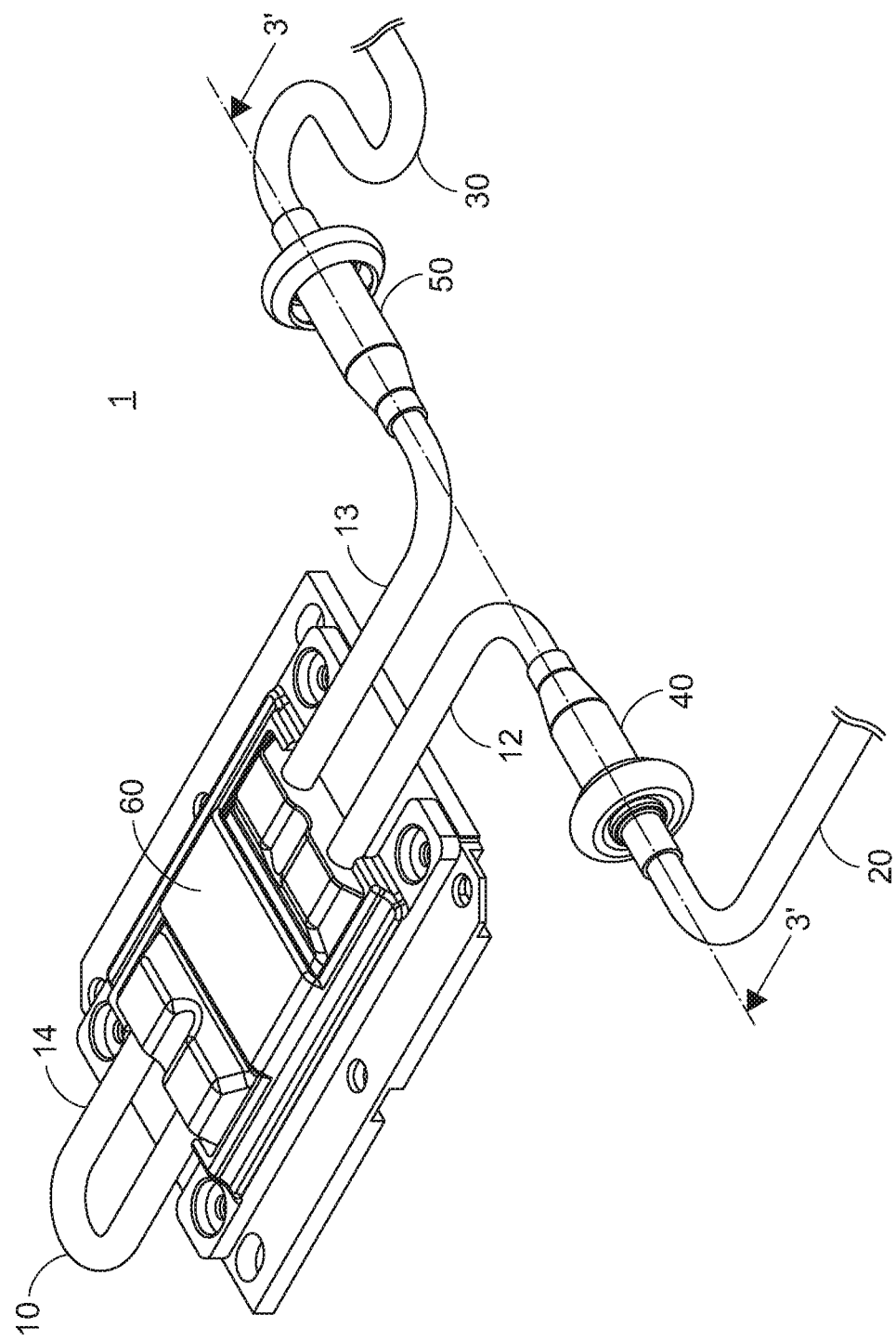
FIG. 1 is a schematic perspective view illustrating a rotatable water-cooling tube according to a first embodiment of the present invention.
Figure 2:
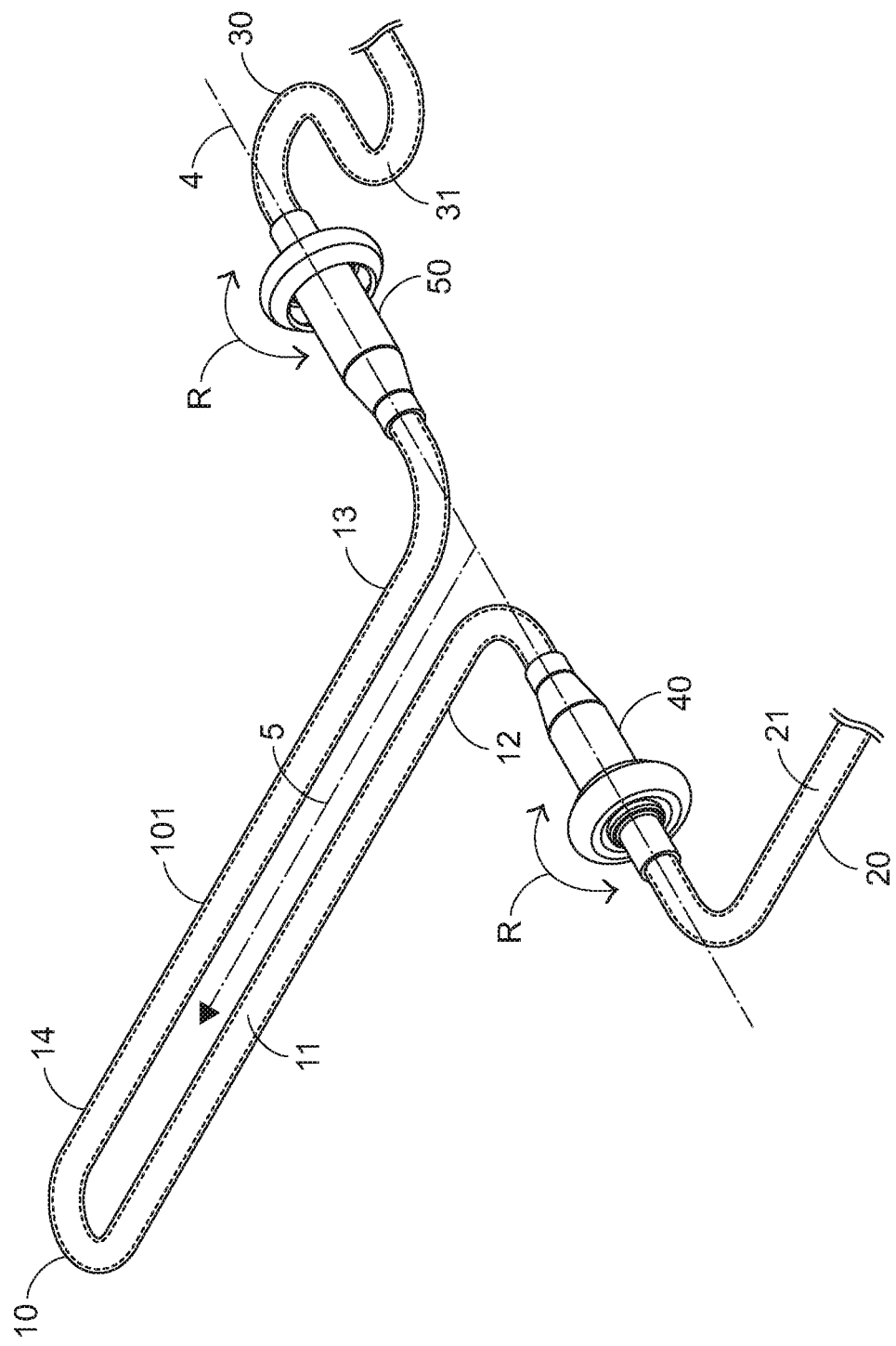
FIG. 2 is a schematic perspective view illustrating a variant example of the rotatable water-cooling tube according to the first embodiment of the present invention.

A first embodiment of the present invention will be described as follows. FIG. 1 is a schematic perspective view illustrating a rotatable water-cooling tube according to a first embodiment of the present invention. FIG. 2 is a schematic perspective view illustrating a variant example of the rotatable water-cooling tube according to the first embodiment of the present invention. In this embodiment, the rotatable water-cooling tube 1 comprises a first tube body 10, a second tube body 20, a third tube body 30, a first connector 40 and a second connector 50. The first tube body 10 comprises a first tube channel 11, a first end 12, a second end 13 and a third end 14. The first tube channel 11 is in communication with the first end 12, the second end 13 and the third end 14. The second tube body 20 comprises a second tube channel 21. The third tube body 30 comprises a third tube channel 31. The first connector 40 is located at the first end 12 of the first tube body 10. In addition, the first connector 40 is in communication with the first tube body 10 and the second tube body 20. The second connector 50 is located at the second end 13 of the first tube body 10. In addition, the second connector 50 is in communication with the first tube body 10 and the third tube body 30. Consequently, the first tube body 10, the second tube body 20 and the third tube body 30 are in communication with each other. The first connector 40 and the second connector 50 of the first tube body 10 are rotatable in the direction R. Consequently, the first tube body 10 is rotatable relative to the second tube body 20 and the third tube body 30 in the direction R.

In this embodiment, the rotatable water-cooling tube 1 is further equipped with a heat dissipation element 60. The heat dissipation element 60 is installed at the third end 14 of the first tube body 10. Moreover, as the first tube body 10 is rotated in the direction R, the position of the heat dissipation element 60 is correspondingly changed. The installation of the heat dissipation element 60 on the rotatable water-cooling tube 1 is not restricted. In an embodiment, the inner position of the heat dissipation element 60 is in communication with the first tube channel 11 of the first tube body 10. In another embodiment, the heat dissipation element 60 is attached on an outer wall 101 of the first tube body 10.

The arrangements of the first connector 40 and the second connector 50 will be described as follows. Please refer to FIG. 2 again. In this embodiment, the first connector 40 and the second connector 50 are aligned with each other. Moreover, the first tube body 10 is connected with the first connector 40 and the second connector 50. More especially, the first connector 40 and the second connector 50 are coaxially arranged along an axial line 4, and the first connector 40 and the second connector 50 are rotatable in the direction R. An extending direction 5 of the first tube body 10 is perpendicular to the axial line 4. While the first connector 40 and the second connector 50 are rotated, the first tube body 10 is also rotated about the axial line 4.

Figure 3:
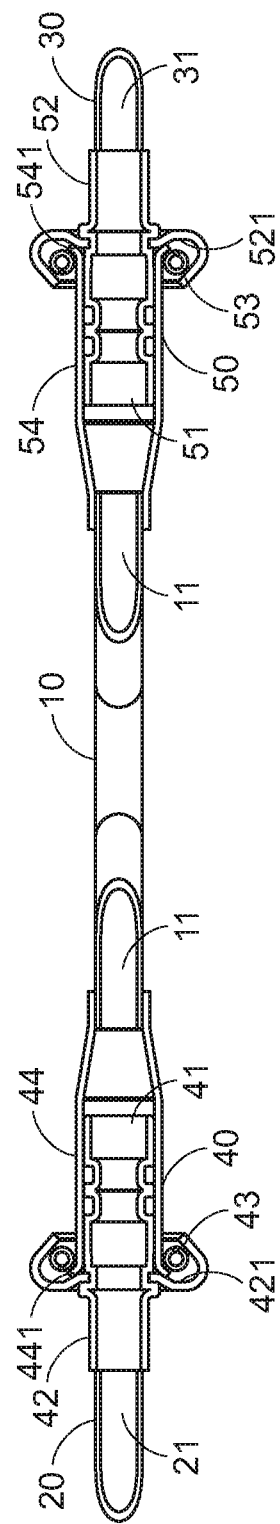
FIG. 3 is a schematic cross-sectional view illustrating the rotatable water-cooling tube according to the first embodiment of the present invention and taken along the line 3'-3'.
Figure 4:
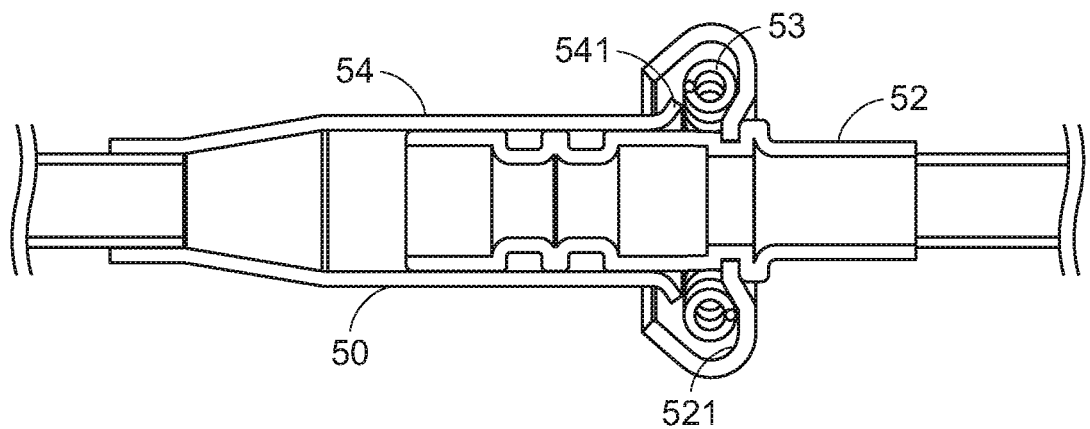
FIG. 4 is a schematic cross-sectional view illustrating the second connector of the rotatable water-cooling tube according to the first embodiment of the present invention.
Figure 5:
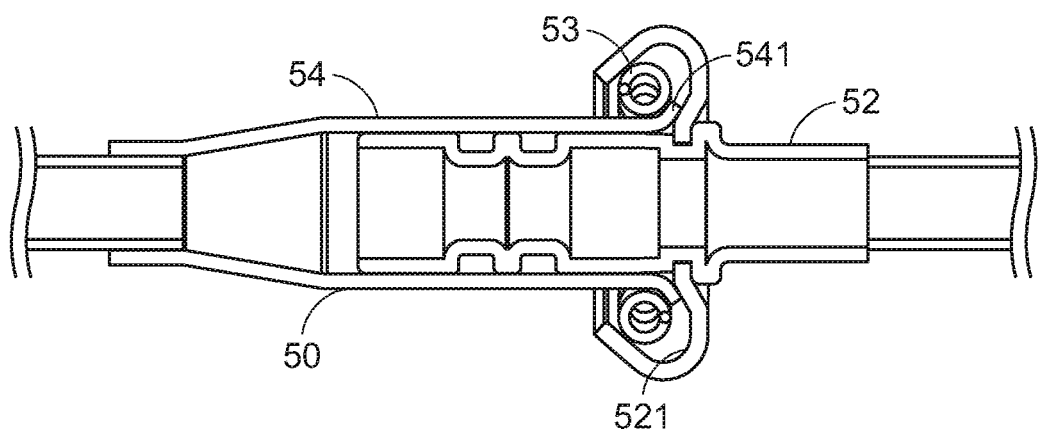
FIG. 5 is a schematic cross-sectional view illustrating the second connector of the rotatable water-cooling tube according to the first embodiment of the present invention.

The internal structures of the first connector 40 and the second connector 50 will be described in more details as follows. FIG. 3 is a schematic cross-sectional view illustrating the rotatable water-cooling tube according to the first embodiment of the present invention and taken along the line 3'-3'. FIG. 4 is a schematic cross-sectional view illustrating the second connector of the rotatable water-cooling tube according to the first embodiment of the present invention. FIG. 5 is a schematic cross-sectional view illustrating the second connector of the rotatable water-cooling tube according to the first embodiment of the present invention.

Please refer to the cross-sectional view of FIG. 3. The first connector 40 comprises a first coupling channel 41, a first interface part 42, a first engaging spring 43 and a first insertion part 44. The second connector 50 comprises a second coupling channel 51, a second interface part 52, a second engaging spring 53 and a second insertion part 54. The first interface part 42 has a first inner wall 421. The first engaging spring 43 is disposed on the first inner wall 421. The second interface part 52 has a second inner wall 521. The second engaging spring 53 is disposed on the second inner wall 521. A first ring-shaped structure 441 is protruded from an outer periphery of the first insertion part 44. A second ring-shaped structure 541 is protruded from an outer periphery of the second insertion part 54. The first interface part 42 of the first connector 40 is connected with the second tube body 20. The first coupling channel 41 is communication with the second tube channel 21. The first insertion part 44 is connected with the first tube body 10 and in communication with the first tube channel 11. When the first insertion part 44 is inserted in the first interface part 42, the second tube channel 21 is in communication with the first tube channel 11 through the first coupling channel 41. The second interface part 52 of the second connector 50 is connected with the third tube body 30. The second coupling channel 51 is in communication with the third tube channel 31. The second insertion part 54 is connected with the first tube body 10 and in communication with the first tube channel 11. When the second insertion part 54 is inserted in the second interface part 52, the third tube channel 31 is in communication with the first tube channel 11 through the second coupling channel 51.

The process of inserting the insertion part in the corresponding interface part will be described as follows. Please refer to FIGS. 4 and 5. Since the structure of the first connector 40 is similar to the structure of the second connector 50, only the structure of the second connector 50 will be described. The second engaging spring 53 is disposed on the second inner wall 521. During the process of inserting the second insertion part 54 in the second interface part 52, the second ring-shaped structure 541 of the second insertion part 54 is firstly moved to a position near a seam between the second engaging spring 53 and the second interface part 52 (see FIG. 4). Then, a larger external force is applied. Consequently, the second ring-shaped structure 541 is moved across the seam between the second engaging spring 53 and the second interface part 52, and the second engaging spring 53 is sheathed around the second ring-shaped structure 541 (see FIG. 5). Under this circumstance, the second interface part 52 and the second insertion part 54 are rotatably coupled with each other.

In some embodiment, the first connector 40 and the second connector 50 are quick connectors, which can be easily installed in a swappable manner and can be rotated.

Figure 6:
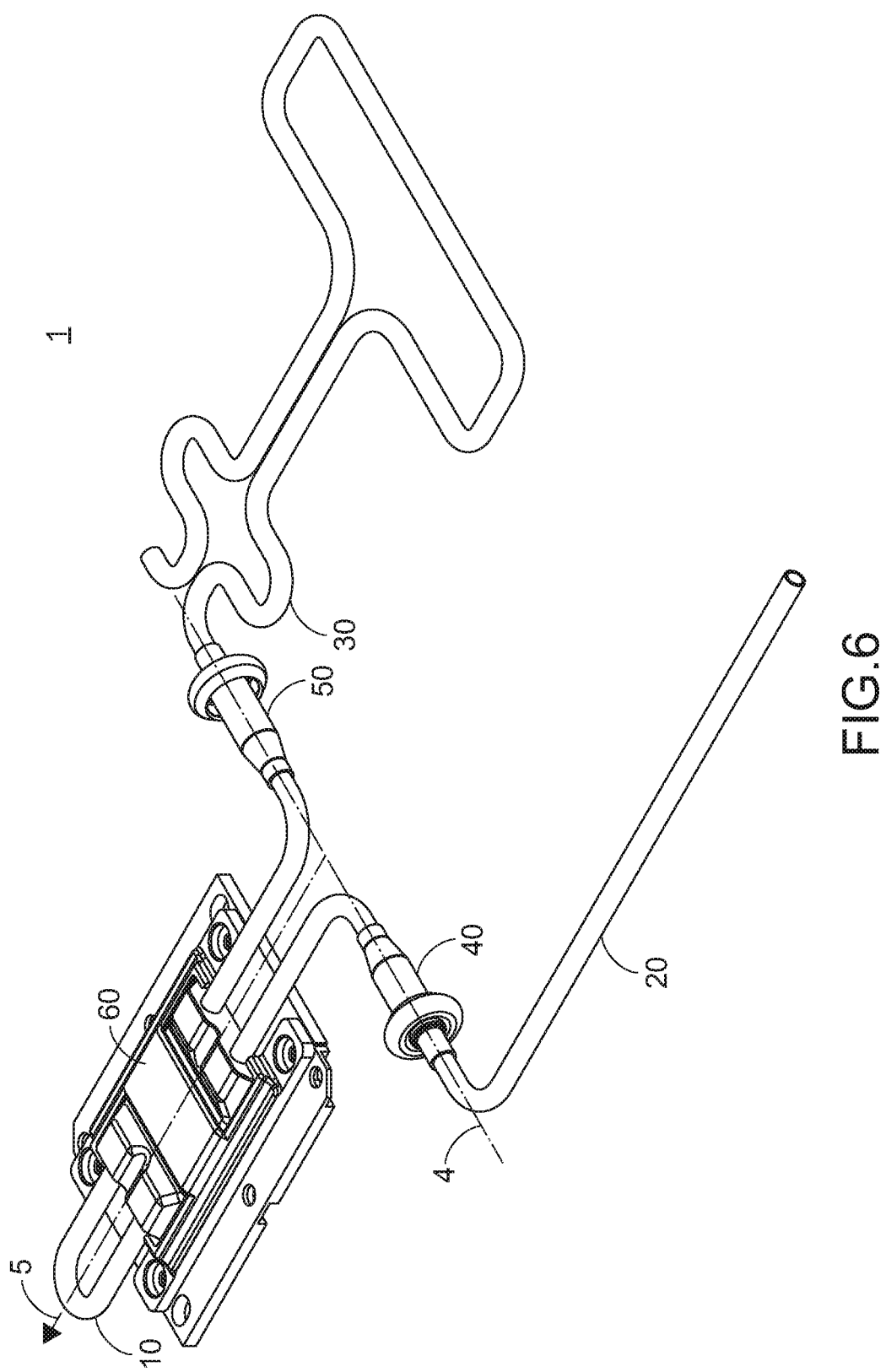
FIG. 6 is a schematic perspective view illustrating the rotatable water-cooling tube according to the first embodiment of the present invention and in a non-rotated status.
Figure 7:
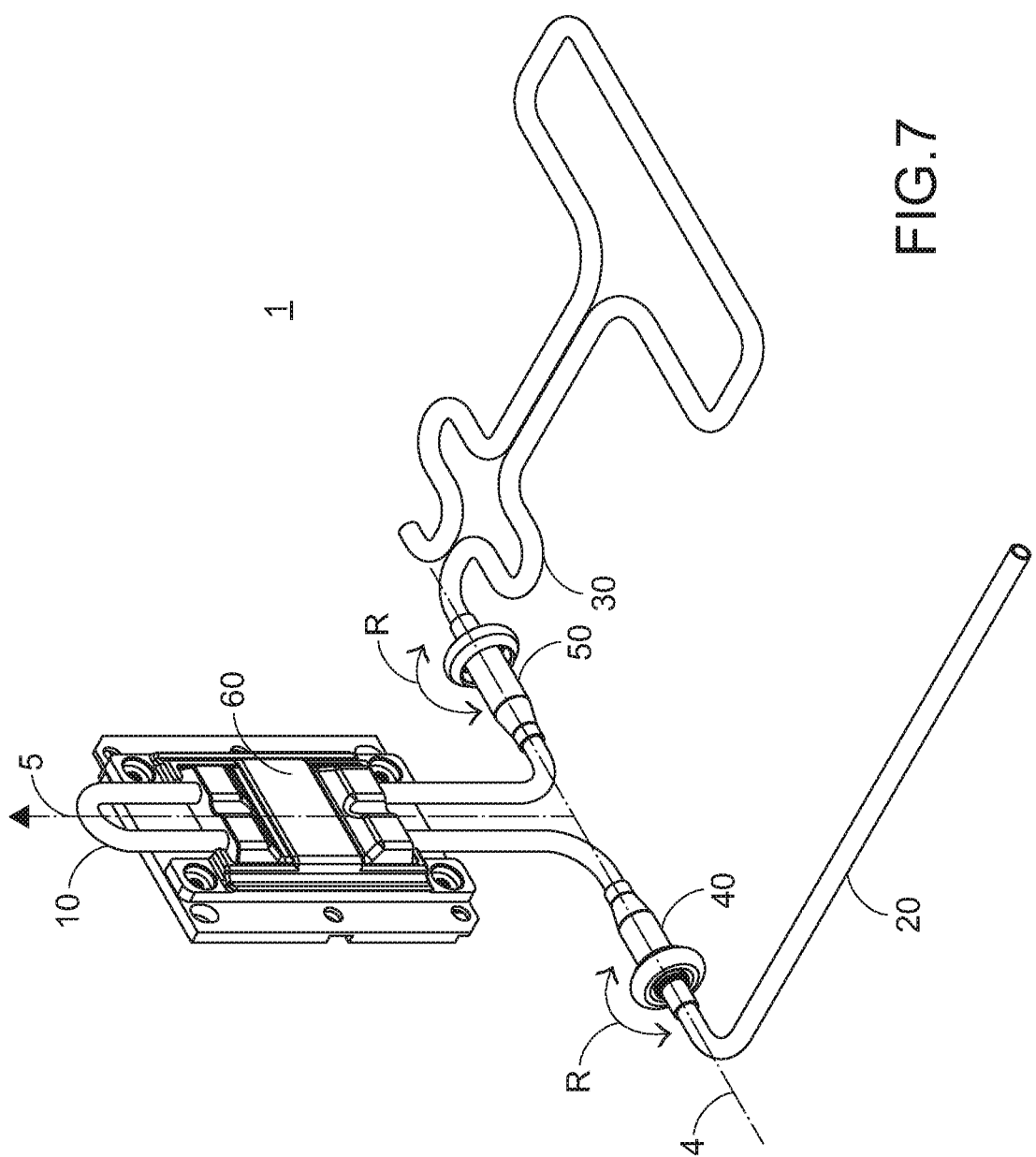
FIG. 7 is a schematic perspective view illustrating the rotatable water-cooling tube according to the first embodiment of the present invention and in a rotated status.

The rotatable water-cooling tube 1 in a non-rotated status and a rotated status will be described with reference to FIGS. 6 and 7. FIG. 6 is a schematic perspective view illustrating the rotatable water-cooling tube according to the first embodiment of the present invention and in a non-rotated status. FIG. 7 is a schematic perspective view illustrating the rotatable water-cooling tube according to the first embodiment of the present invention and in a rotated status.

Please refer to FIG. 6. In the non-rotated status of the rotatable water-cooling tube 1, the second tube body 20 and the third tube body 30 of the rotatable water-cooling tube 1 are fixed and cannot be rotated. The first tube body 10 is pivotally coupled to the first connector 40 and the second connector 50. The extending direction 5 of the first tube body 10 is perpendicular to the axial line 4. The heat dissipation element 60 is installed on the first tube body 10. Meanwhile, the first tube body 10, the second tube body 20, the third tube body 30 and the heat dissipation element 60 are located at the same plane.

Please refer to FIG. 7. While the first tube body 10 is rotated and the first connector 40 and the second connector 50 are rotated in the direction R, the first tube body 10 is rotated about the axial line 4. As the first tube body 10 is rotated, the first tube body 10 is moved away its original position. Meanwhile, the heat dissipation element 60 and the first tube body 10 are not coplanar with the second tube body 20 and the third tube body 30. In case that the first connector 40 and the second connector 50 are rotated in the reverse direction of the direction R, the heat dissipation element 60 and the first tube body 10 can be returned to their original positions.

Figure 8:
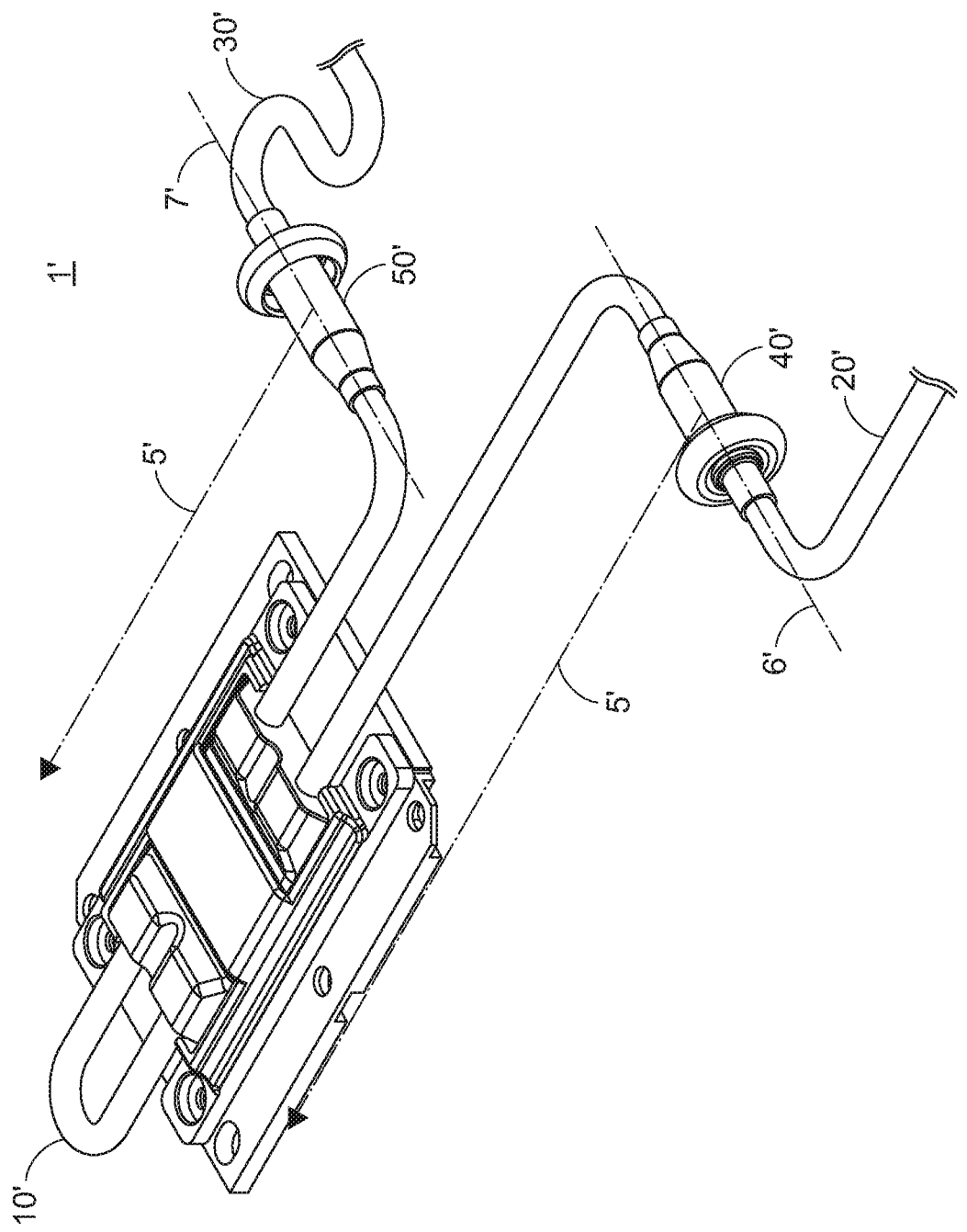
FIG. 8 is a schematic perspective view illustrating a rotatable water-cooling tube according to a second embodiment of the present invention.

A second embodiment of the present invention will be described as follows. FIG. 8 is a schematic perspective view illustrating a rotatable water-cooling tube according to a second embodiment of the present invention. For succinctness, the structures of the components of the rotatable water-cooling tube of this embodiment that are similar to those of the first embodiment will not be redundantly described herein. In this embodiment, the rotatable water-cooling tube 1' comprises a first tube body 10', a second tube body 20', a third tube body 30', a first connector 40' and a second connector 50'. The first tube body 10' is in communication with the second tube body 20' and the third tube body 30' through the first connector 40' and the second connector 50'. In comparison with the first embodiment, the first connector 40' is arranged along a first axial line 6', and the second connector 50' is arranged along a second axial line 7'. The first axial line 6' and the second axial line 7 are in parallel with each other, but are not coaxial. That is, the first connector 40 and the second connector 50 are not coaxially arranged along the same axial line. The first connector 40' is rotatable about the first axial line 6'. The second connector 50' is rotatable about the second axial line 7'. Similarly, the extending direction 5' of the first tube body 10' is perpendicular to the first axial line 6' and the second axial line 7'. Consequently, while the first connector 40' and the second connector 50' are rotated in the same direction, the first tube body 10' is rotated about the first axial line 6' and the second axial line 7'.

Figure 9:
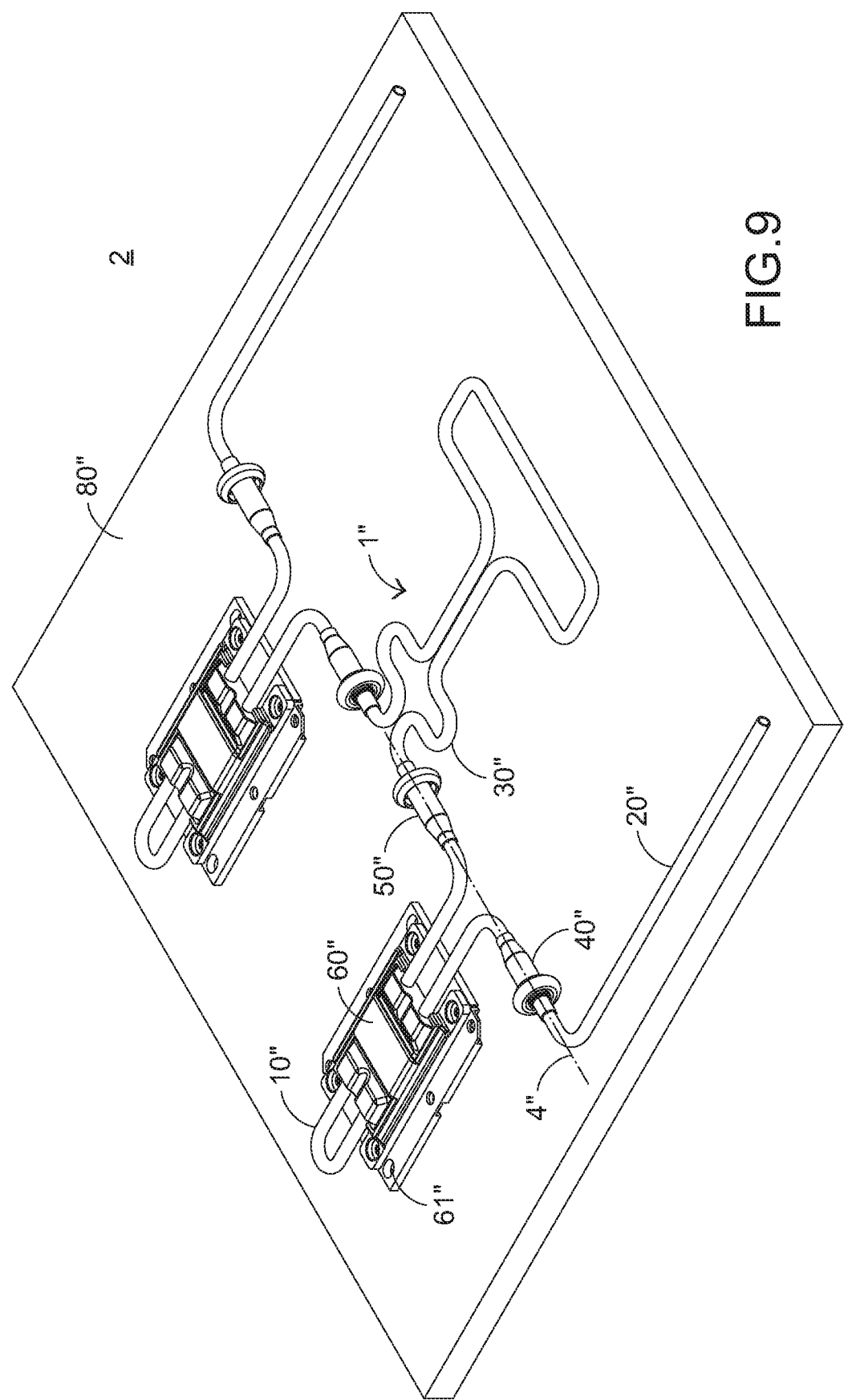
FIG. 9 is a schematic perspective view illustrating an electronic device with a rotatable water-cooling tube according to a third embodiment of the present invention, in which the rotatable water-cooling tube is in a non-rotated status.
Figure 10:
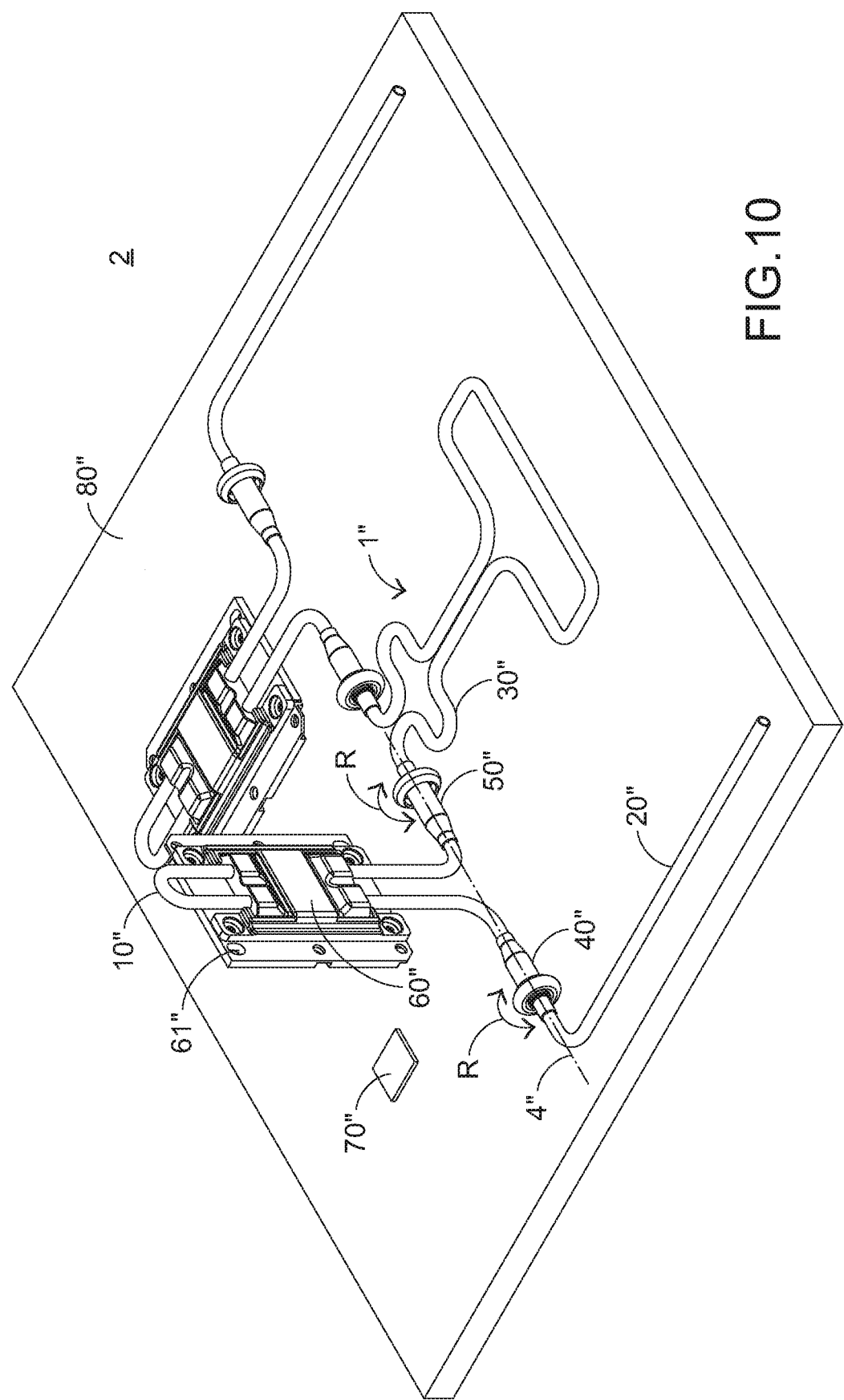
FIG. 10 is a schematic perspective view illustrating the electronic device as shown in FIG. 9, in which the rotatable water-cooling tube is in a rotated status.

The present invention also provides an electronic device with the rotatable water-cooling tube. FIG. 9 is a schematic perspective view illustrating an electronic device with a rotatable water-cooling tube according to a third embodiment of the present invention, in which the rotatable water-cooling tube is in a non-rotated status. FIG. 10 is a schematic perspective view illustrating the electronic device as shown in FIG. 9, in which the rotatable water-cooling tube is in a rotated status. In this embodiment, the electronic device 2 comprises a base plate 80", a rotatable water-cooling tube 1" and a heat generation component 70". The rotatable water-cooling tube 1" comprises a first tube body 10", a second tube body 20", a third tube body 30", a first connector 40", a second connector 50" and a heat dissipation element 60". The first connector 40" and the second connector 50" of the rotatable water-cooling tube 1" are disposed on the base plate 80". The first tube body 10" is in communication with the second tube body 20" and the third tube body 30" through the first connector 40" and the second connector 50". The heat dissipation element 60" is installed on the first tube body 10". The heat generation component 70" is disposed on the base plate 80" and located under the heat dissipation element 60". The first connector 40" and the second connector 50" are arranged along an axial line 4". While the first connector 40" and the second connector 50" are rotated, the first tube body 10" is correspondingly rotated. As the first tube body 10" is rotated, the heat dissipation element 60" is selectively contacted with the heat generation component 70" or away from the heat generation component 70".

Please refer to FIG. 9. In the non-rotated status of the rotatable water-cooling tube 1", the second tube body 20" and the third tube body 30" are fixed on the base plate 80". However, the first connector 40" and the second connector 50" are not fixed on the base plate 80". Consequently, the first connector 40" and the second connector 50" are rotatable in the direction R" (see FIG. 10). The first tube body 10" is pivotally coupled to the first connector 40" and the second connector 50". Meanwhile, the first tube body 10", the second tube body 20", the third tube body 30" and the heat dissipation element 60" are located at the same plane.

Please refer to FIG. 10. For installing the heat generation component 70" (e.g., a chip or a processor) on the base plate 80" at the position under the first tube body 10", the user may rotate the first tube body 10" to lift the first tube body 10". As the first tube body 10" is rotated, the first tube body 10" is moved away its original position. Consequently, the process of installing the heat generation component 70" on the base plate 80" will not be hindered by the first tube body 10" and the heat dissipation element 60". After the heat generation component 70" is installed on the base plate 80", the first tube body 10" and the heat dissipation element 60" are rotated in the reverse direction of the direction R". Consequently, the first tube body 10" and the heat dissipation element 60" are returned to their original positions, and the heat dissipation element 60" is precisely and closely attached on the heat generation component 70". In an embodiment, the heat dissipation element 60" further comprises at least one bolt hole 61". After the heat dissipation element 60" is attached on the heat generation component 70", a screwing element (not shown) is penetrated through the bolt hole 61" and tightened in the base plate 80". Consequently, the heat dissipation element 60" is fixed on the base plate 80". In such way, the efficacy of transferring the heat to the heat dissipation element 60" is enhanced and structure is stabilized.

It is noted that the shape of the first tube bodies 10, 10' and 10" are not restricted to the shapes of the above embodiments. For example, in some other embodiments, the first tube body is a curvy bent tube or irregular bent tube.

Moreover, a working fluid (not shown) is received within each of the rotatable water-cooling tubes 1', 1' and 1". After the heat from the heat generation component is transferred to the rotatable water-cooling tube 1', 1' or 1", the heat is absorbed by the working fluid. As the working fluid flows through the rotatable water-cooling tube, the heat is dissipated away the heat generation component. Since the heat generation component is not overheated, the heat generation component is not damaged.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all modifications and similar structures.

What is claimed is:
1. A rotatable water-cooling tube, comprising:
 a first tube body comprising a first tube channel, a first end and a second end, wherein the first tube channel is in communication with the first end and the second end;
 a second tube body arranged beside the first end of the first tube body;
 a third tube body arranged beside the second end of the first tube body;
 a first connector located at the first end of the first tube body, wherein the first connector is in communication with and connected between the first end of the first tube body and the second tube body, the first connector comprises a first interface part and a first engaging spring, the first engaging spring is disposed on a first inner wall of the first interface part; and
 a second connector located at the second end of the first tube body, wherein the second connector is in communication with and connected between the second end of the first tube body and the third tube body, the second connector comprises a second interface part and a second engaging spring, the second engaging spring is disposed on a second inner wall of the second interface part, wherein the first tube body is rotatable with the first connector and the second connector, and an extending direction of the first tube body is perpendicular to a first axial line through the first connector and a second axial line through the second connector.

2. The rotatable water-cooling tube according to claim 1, wherein the first connector and the second connector are aligned with each other, and the first tube body is pivotally coupled to the first connector and the second connector.

3. The rotatable water-cooling tube according to claim 1, wherein the first axial line through the first connector and the second axial line through the second connector are coaxially arranged along an axial line, and the first connector and the second connector are rotatable about the axial line.

4. The rotatable water-cooling tube according to claim 1, wherein the first axial line and the second axial line are in parallel with each other, but are not coaxial, wherein the first connector is rotatable about the first axial line, and the second connector is rotatable about the second axial line.

5. The rotatable water-cooling tube according to claim 1, wherein the second tube body comprises a second tube channel, and the first connector comprises a first coupling channel, wherein the first coupling channel is communication with the first tube channel and the second tube channel.

6. The rotatable water-cooling tube according to claim 1, wherein the third tube body comprises a third tube channel, and the second connector comprises a second coupling channel, wherein the second coupling channel is communication with the first tube channel and the third tube channel.

7. The rotatable water-cooling tube according to claim 1, wherein the first connector and the second connector are quick connectors.

8. The rotatable water-cooling tube according to claim 1, wherein the first tube body further comprises a third end, and a heat dissipation element is installed on the third end of the first tube body.

9. The rotatable water-cooling tube according to claim 8, wherein the heat dissipation element is in communication with the first tube channel of the first tube body, or the heat dissipation element is attached on an outer wall of the first tube body.

10. An electronic device, comprising:
a rotatable water-cooling tube comprising:
a first tube body comprising a first tube channel, a first end and a second end, wherein the first tube channel is in communication with the first end and the second end;
a second tube body arranged beside the first end of the first tube body;
a third tube body arranged beside the second end of the first tube body;
a first connector located at the first end of the first tube body, wherein the first connector is in communication with and connected between the first end of the first tube body and the second tube body, the first connector comprises a first interface part and a first engaging spring, the first engaging spring is disposed on a first inner wall of the first interface part; and
a second connector located at the second end of the first tube body, wherein the second connector is in communication with and connected between the second end of the first tube body and the third tube body, wherein the first tube body is rotatable with the first connector and the second connector, an extending direction of the first tube body is perpendicular to a first axial line through the first connector and a second axial line through the second connector, the second connector comprises a second interface part and a second engaging spring, the second engaging spring is disposed on a second inner wall of the second interface part; and
a heat generation component in contact with the first tube body of the rotatable water-cooling tube.

11. The electronic device according to claim 10, wherein the electronic device further comprises a base plate, and the heat generation component is installed on the base plate and the rotatable water-cooling tube further comprises a heat dissipation element, wherein as the first tube body is rotated with the first connector and the second connector, the heat dissipation element is selectively contacted with the heat generation component or away from the heat generation component.

12. The electronic device according to claim 11, wherein the second tube body and the third tube body are fixed on the base plate.

13. The electronic device according to claim 10, wherein the rotatable water-cooling tube further comprises a heat dissipation element, and the heat dissipation element is installed on the first tube body.

14. The electronic device according to claim 13, wherein as the first tube body is rotated, the heat dissipation element is selectively contacted with the heat generation component or away from the heat generation component.

15. The electronic device according to claim 10, wherein the first connector and the second connector are aligned with each other, and the first tube body is pivotally coupled to the first connector and the second connector.

16. The electronic device according to claim 10, wherein the first axial line through the first connector and the second axial line through the second connector are coincided with an axial line, and the first connector and the second connector are rotatable about the axial line.

17. The electronic device according to claim 10, wherein the first axial line and the second axial line are in parallel with each other, but are not coaxial, wherein the first connector is rotatable about the first axial line, and the second connector is rotatable about the second axial line.

18. The electronic device according to claim 10, wherein the second tube body comprises a second tube channel, and the first connector comprises a first coupling channel, wherein the first coupling channel is communication with the first tube channel and the second tube channel.

19. The electronic device according to claim 10, wherein the third tube body comprises a third tube channel, and the second connector comprises a second coupling channel, wherein the second coupling channel is communication with the first tube channel and the third tube channel.

20. The electronic device according to claim 10, wherein the first connector and the second connector are quick connectors.

* * * * *